(12) United States Patent
Ismail et al.

(10) Patent No.: US 8,316,717 B2
(45) Date of Patent: Nov. 27, 2012

(54) WIRELESS SELF-POWERED MONOLITHIC INTEGRATED CAPACITIVE SENSOR AND METHOD OF MANUFACTURE

(75) Inventors: Salleh Ismail, El Monte, CA (US); Patrick Kayatta, Medford, OR (US)

(73) Assignee: Rogue Valley Microdevices, Inc., Medford, OR (US)

( * ) Notice: Subject to any disclaimer, the term of this patent is extended or adjusted under 35 U.S.C. 154(b) by 113 days.

(21) Appl. No.: 12/826,316

(22) Filed: Jun. 29, 2010

(65) Prior Publication Data

US 2011/0314922 A1 Dec. 29, 2011

(51) Int. Cl.
*G01L 9/12* (2006.01)
(52) U.S. Cl. .............................. 73/718; 73/724
(58) Field of Classification Search ............. 73/700–756
See application file for complete search history.

(56) References Cited

U.S. PATENT DOCUMENTS

| | | | |
|---|---|---|---|
| 4,636,714 A * | 1/1987 | Allen | 324/678 |
| 5,178,015 A * | 1/1993 | Loeppert et al. | 73/718 |
| 5,499,158 A * | 3/1996 | Bishop et al. | 361/283.4 |
| 5,576,251 A | 11/1996 | Garabedian | |
| 5,578,843 A * | 11/1996 | Garabedian et al. | 257/254 |
| 5,804,736 A * | 9/1998 | Klauder et al. | 73/724 |
| 5,923,952 A | 7/1999 | Ismail | |
| 5,929,498 A | 7/1999 | Ismail | |
| 5,966,617 A | 10/1999 | Ismail | |
| 6,038,928 A * | 3/2000 | Maluf et al. | 73/724 |
| 6,465,271 B1 * | 10/2002 | Ko et al. | 438/48 |
| 6,629,465 B1 * | 10/2003 | Maluf et al. | 73/724 |
| 6,945,115 B1 | 9/2005 | Wang | |
| 7,100,432 B2 | 9/2006 | Forster | |
| 7,181,975 B1 | 2/2007 | Bradley | |
| 7,603,894 B2 | 10/2009 | Breed | |
| 7,645,701 B2 | 1/2010 | Anderson | |
| 2002/0151100 A1 * | 10/2002 | Coffa et al. | 438/50 |
| 2002/0151816 A1 * | 10/2002 | Rich et al. | 600/547 |
| 2006/0260408 A1 * | 11/2006 | Villa et al. | 73/715 |
| 2009/0001998 A1 * | 1/2009 | Tateishi et al. | 324/686 |
| 2009/0030291 A1 | 1/2009 | O'Brien | |
| 2009/0049911 A1 * | 2/2009 | Fukuda et al. | 73/514.32 |
| 2009/0165546 A1 | 7/2009 | Cook | |
| 2010/0269595 A1 * | 10/2010 | Villa et al. | 73/718 |
| 2011/0000303 A1 * | 1/2011 | Fortner et al. | 73/724 |

* cited by examiner

*Primary Examiner* — Andre Allen
(74) *Attorney, Agent, or Firm* — Manuel de la Cerra

(57) ABSTRACT

Disclosed is a wireless self-powered monolithic integrated capacitive sensor, as well as methods of manufacturing same. A single monolithic chip may include various technologies, including RF MEMS, CMOS devices and related circuitry, and physical sensor MEMS. An example pressure sensor is disclosed, including a sensing capacitor and a reference capacitor that together allow the system to provide steady output in various environmental conditions. In one embodiment a pre-fabricated circuit wafer is fusion bonded to a pre-fabricated diaphragm wafer. Doped silicon may form the monolithic structure to provide the voltage necessary to run the system.

18 Claims, 14 Drawing Sheets

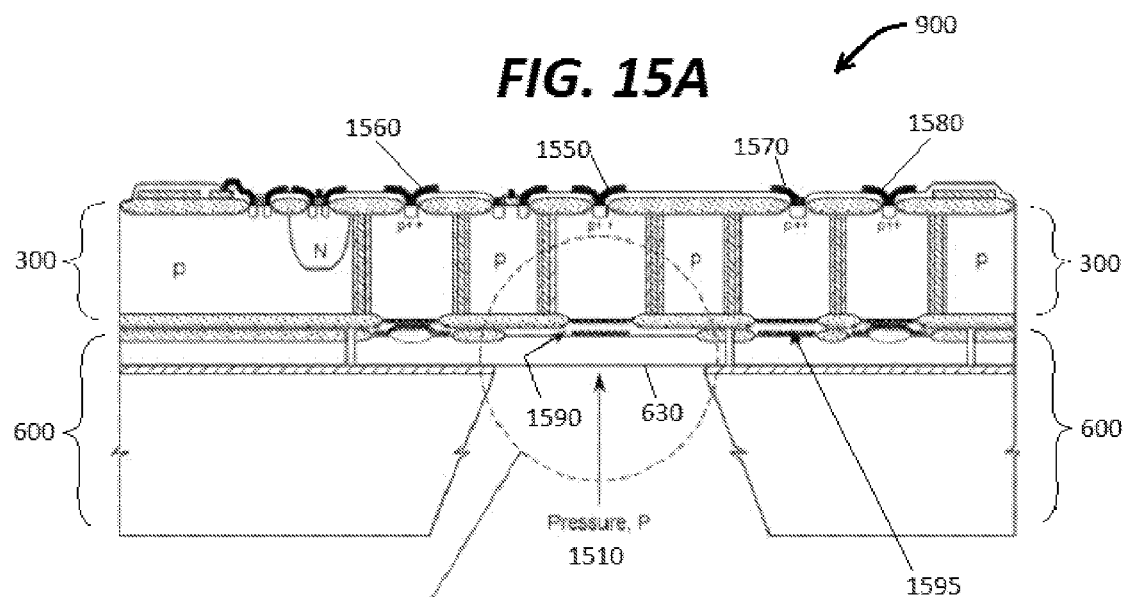

WIRELESS SELF-POWERED MONOLITHIC INTEGRATED CAPACITIVE SENSOR AND METHOD OF MANUFACTURE

BACKGROUND

1. Field of the Invention

The invention relates to a wireless self-powered monolithic integrated capacitive sensor and method of manufacturing same.

2. Discussion of the Background

The following United States patents and applications relate to capacitive sensors, radio frequency (RF) or wireless, implantable, self-powered or battery-less devices, and are incorporated herein by reference in their entireties.

U.S. Pat. No. 7,603,894, issued on Oct. 20, 2009 to Breed (the '894 patent), describes a vehicular tire monitoring system including an energy providing system arranged on the tire, and a sensor system arranged on the tire and coupled to the energy providing system to be provided with energy by the energy providing system. The sensor system obtains data about at least one property of the tire, such as pressure, and converts the data into signals. A communication system is arranged on a frame of the vehicle and wirelessly communicates with the sensor system to receive the signals from the sensor system and derives, from the signals, the data obtained by the sensor system. A reactive system on the frame of the vehicle may be responsive to the data obtained by the sensor system, e.g., a display to display the data about the tire such as its pressure, or a communications system which transmits data about the tire to a remote site. The '894 patent is incorporated herein in its entirety by reference.

U.S. Pat. No. 7,181,975, issued on Feb. 27, 2007 to Bradley, et al. (the '975 patent), describes a wireless pressure sensor system having a pressure sensing capacitor and an inductor mounted on a common housing. The pressure sensing capacitor has a conductive diaphragm, a dielectric layer and a fixed electrode separated at least in part from the diaphragm by a gap formed in the housing. The electrode is arranged with a protrusion such that displacement of the diaphragm varies the area of capacitive contact with the electrode by rolling along the protrusion. The inductor coil and pressure sensing capacitor are connected to form a passive inductive-capacitive (LC) tank circuit. A remote interrogation circuit, inductively coupled to the pressure sensor inductor coil can be utilized to detect the resonant frequency of the LC tank which varies as a function of pressure sensed by the diaphragm. The '975 patent is incorporated herein in its entirety by reference.

U.S. Pat. No. 7,100,432, issued on Sep. 5, 2006 to Forster (the '432 patent), describes a capacitive pressure sensor comprising a pair of conductive plates surrounding a compressible dielectric to form a capacitor. Changes in pressure create changes in the capacitance of the capacitor which in turn may be measured to determine the changes in pressure. The pressure sensor may be constructed to be temperature and centripetal force compensated so that it may be positioned in a tire. A further embodiment uses the conductive plates to form a radiating element for the sensor such that it may wirelessly communicate with a remote interrogator. The '432 patent is incorporated herein in its entirety by reference.

U.S. Pat. No. 6,945,115, issued on Sep. 20, 2005 to Wang (the '115 patent), describes a Capacitive Micromachined Ultrasonic Radio Frequency (CMURF) pressure sensor. This micromachined pressure sensor has pressure sensitive capacitance elements including a scalable array of micromachined cells of the type including electrodes carried by a sealed membrane supported above a common electrode with conductive lines interconnecting the electrodes having an electrostatic capacitance $\Delta C_m$ changing with a pressure to be detected. This micromachined pressure sensor also has reference capacitance elements including a scalable array of micromachined cells of the type including electrodes carried by a stacked of membranes supported above a common electrode with conductive lines interconnecting the electrodes having an electrostatic capacitance $C_m$ not changing with the pressure. A method of operating a pressure sensor array is also described. The '115 patent is incorporated herein in its entirety by reference.

U.S. Pat. App. No. 20090030291, published on Jan. 29, 2009 to O'Brien, et al. (the '291 application), describes a wireless sensor for indicating a physical state within an environment, including a unitary housing defining a cavity. A structure located within the cavity of the housing has elements providing capacitance, the elements being arranged such that the distance and thereby the capacitance of the structure changes when a physical state of the environment changes. The structure has a resonant frequency based at least in part on the capacitance of the structure when in the presence of a fluctuating electromagnetic field. When the sensor is positioned within an environment and is subjected to a fluctuating electromagnetic field, the resonant frequency indicates the physical state of the environment. The '291 application is incorporated herein in its entirety by reference.

U.S. Pat. App. No. 20090165546, published on Jul. 2, 2009 to Cook, et al. (the '546 application), describes a wireless and battery-less pressure sensor apparatus comprising a surface acoustic wave (SAW) sensor and an antenna mounted on a printed circuit board. Optionally, a radio-frequency identification (RFID) tag in used in combination with the SAW sensor. A sensor antenna and a RFID antenna can be located on the printed circuit board such that the antennas communicate electrically with the sensor and the RFID device. The sensor can be interrogated utilizing a radio frequency, which is used to excite a SAW crystal inside the sensor. The interrogation signal causes the SAW to resonate wherein a resonant frequency changes with the pressure and temperature that is applied to the sensor. An interrogator can receive a return (echo) signal representing a change in SAW sensor properties (e.g., diaphragm change). A printed circuit board can be mounted on a stainless steel port and overpackaged with standard processes for hermetically sealing the sensor, or sensor and RFID device with at least one antenna. The '546 application is incorporated herein in its entirety by reference.

The following United States patents and applications relate to integrated pressure sensor devices using complementary metal-oxide-semiconductors (CMOS), fusion-bond flexible structure, and surface single crystal micromachining utilizing local oxidation of Silicon and etch-back to form sensing depressions, and are incorporated herein by reference in their entireties.

U.S. Pat. No. 5,576,251, issued on Nov. 19, 1996 to Garabedian, et al. (the '251 patent) and U.S. Pat. No. 5,578,843, issued on Nov. 26, 1996 to Garabedian, et al. (the '843 patent), both describe fabrication of semiconductor devices with movable structures, and includes local oxidation of a wafer and oxide removal to form a depression in an elevated bonding surface. A second wafer is fusion bonded to the elevated bonding surface and shaped to form a flexible membrane. An alternative fabrication technique forms a spacer having a depression on a first wafer and active regions on a second wafer, and fusion bonds the wafers together with the depression over the active regions. Devices formed are integrable with standard MOS devices and include FETs, capacitors, and sensors with movable membranes. An FET sensor has gate and drain coupled together and a drain-source voltage which depends on the gate's deflection. Selected operating current, channel length, and channel width provide a drain-source voltage linearly related to gate deflection. Alternatively, two transistors subjected to the same gate deflection provide a differential voltage related to the square root of the deflection if channel currents or channel widths differ. Transistors subjected to the different gate deflections provide a differential signal that cancels effects that are independent of deflection. A capacitive sensor includes a doped region underlying the center of a flexible membrane. The doped region is isolated from a surrounding region which is biased at the voltage of the membrane. The '251 and '843 patents are incorporated herein in their entirety by reference.

U.S. Pat. No. 5,923,952, issued on Jul. 13, 1999 to Ismail, et al. (the '952 patent), and U.S. Pat. No. 5,929,498, issued on Jul. 27, 1999 to Ismail, et al. (the '498 patent), both describe a semiconductor device having a flexible structure bonded to a semiconductor substructure to form a cavity. The flexible structure is bonded over a conducting feed-through without the feed-through interfering with a hermetic seal formed by bonding. One embodiment of the device includes depressions that contain edges of a diffused feed-through so that imperfections at the edge of the diffusion do not interfere with bonding. The flexible structure is bonded to elevated areas thus hiding the imperfections. In one embodiment, a first elevated region is surrounded by a second elevated region, and diffusion for the feed-through extends from an active region in the cavity across the first elevated region with edges of the diffusion being between the first and second elevated regions. The flexible structure can thus bond to the first and second elevated regions without interference from the edge of the diffused feed-through. A via through the flexible structure to the first elevated region provides electrical contact with the active region. Another embodiment has either a surface or buried well in a semiconductor structure and extending from an active region in the cavity to a point outside the perimeter of the flexible structure. The well provides a conductive feed-through structure without creating imperfections that would interfere with the bonding that seals the cavity. The '952 and '498 patents are incorporated herein in their entirety by reference.

U.S. Pat. No. 5,966,617, issued on Oct. 12, 1999 to Ismail (the '617 patent), describes a multiple local-oxidation-of-Silicon (LOCOS) process to shape a surface of a substrate to form a series of planar regions which are vertically separated from each other. One exemplary process forms a hard mask layer for each LOCOS operation. Another exemplary process includes forming a Silicon nitride mask layer and repeatedly changing the pattern of that mask layer. Each change in the pattern corresponds to a planar region to be formed; and after each change, oxide is grown in openings through the mask layer. The growth of oxide consumes part of the substrate and provides a vertical separation between the planar level corresponding to the pattern and a next higher planar level. Regions of the substrate once exposed by a mask pattern can remain exposed so that subsequent LOCOS operations maintain previously established separations between levels. A hard mask layer can include a polysilicon layer which protects a Silicon nitride layer from conversion to oxide during the repeated LOCOS operations. The '617 patent is incorporated herein in its entirety by reference.

U.S. Pat. No. 7,645,701, issued on Jan. 12, 2010 to Anderson, et al. (the '701 patent), describes a silicon-on-insulator (SOI) structure for forming through vias in a Silicon wafer carrier structure without backside lithography. The SOI structure includes the Silicon wafer carrier structure bonded to a Silicon substrate structure with a layer of buried oxide and a layer of nitride separating these Silicon structures. Vias are formed in the Silicon carrier structure and through the oxide layer to the nitride layer and the walls of the via are passivated. The vias are filled with a filler material of either polysilicon or a conductive material. The substrate structure is then etched back to the nitride layer and the nitride layer is etched back to the filler material. Where the filler material is polysilicon, the polysilicon is etched away forming an open via to the top surface of the carrier wafer structure. The via is then backfilled with conductive material. The '701 patent is incorporated herein in its entirety by reference.

SUMMARY

Provided is a wireless self-powered monolithic integrated capacitive sensor and method of manufacturing same. In one aspect, a wireless self-powered monolithic integrated capacitive sensor is provided, comprising a sensing capacitor that produces a first signal and a reference capacitor that produces a second signal, wherein the wireless self-powered monolithic integrated capacitive sensor produces a sensing signal based on the difference between the first signal and the second signal. The wireless self-powered monolithic integrated capacitive sensor may include a circuit wafer and a diaphragm wafer, which may be fusion bonded. The circuit wafer may have one or more metal silicide plates, while the diaphragm wafer may have one or more metal silicide bump springs, such that a metal silicide plate is in electrical contact with a metal silicide bump spring. In one embodiment the sensor is a pressure sensor. In some embodiments the sensor's output or sensing signal is not substantially affected by variations in temperature.

Also provided is a wireless self-powered monolithic integrated capacitive sensor that includes RF MEMS, a CMOS device, and physical sensor MEMS. Such a sensor can further include, or not, all the features listed in the immediately preceding paragraph.

A method of manufacturing a wireless self-powered monolithic integrated capacitive sensor is also provided, including the steps of fusion bonding a circuit silicon wafer to a diaphragm silicon wafer. Additional steps may include etching an isolation trench on the circuit silicon wafer or the diaphragm silicon wafer to electrically isolate a first portion of the etched wafer from a second portion of the etched wafer. A method may include applying form field oxide by local oxidation of silicon (LOCOS) to the circuit silicon wafer or the diaphragm silicon wafer. One or more metal silicide plates may be applied to the circuit silicon wafer or the diaphragm silicon wafer. Embodiments may include the step of creating an electrically connective bump spring containing metal silicide on the circuit silicon wafer or the diaphragm silicon wafer. Further steps provided include grinding down the circuit silicon wafer or the diaphragm silicon wafer to a predetermined thickness. Also provided are the steps for fabricating the CMOS circuitry. A method may include etching a sensing window in the diaphragm silicon wafer.

BRIEF DESCRIPTION OF THE DRAWINGS

Various advantages and features of the present invention will be more readily understood with reference to the following detailed description and the accompanying drawings in which:

FIG. 14 depicts the Joint Circuit-Diaphragm Wafer of FIG. 13 with a sensing window etched into the lower portion thereof, where

FIG. 15 depicts the Joint Circuit-Diaphragm Wafer of FIG. 14 having pressure applied thereto, where FIG. 15A is a side-elevation, cross-sectional view thereof, FIG. 15B is a detail view of a portion of FIG. 15A before pressure is applied thereto, and FIG. 15C is a detail view of a portion of FIG. 15A after pressure is applied thereto.

DETAILED DESCRIPTION

In the following detailed description, various specific details are recited to provide a thorough understanding of a specific example of the present invention. These examples should not be understood to limit the present invention, which is intended to be defined solely by the claims. Further, certain method steps are delineated as separate steps for ease of understanding; however, these steps should not be construed as necessarily distinct nor order-dependent in their performance, unless otherwise indicated.

Figure 1:
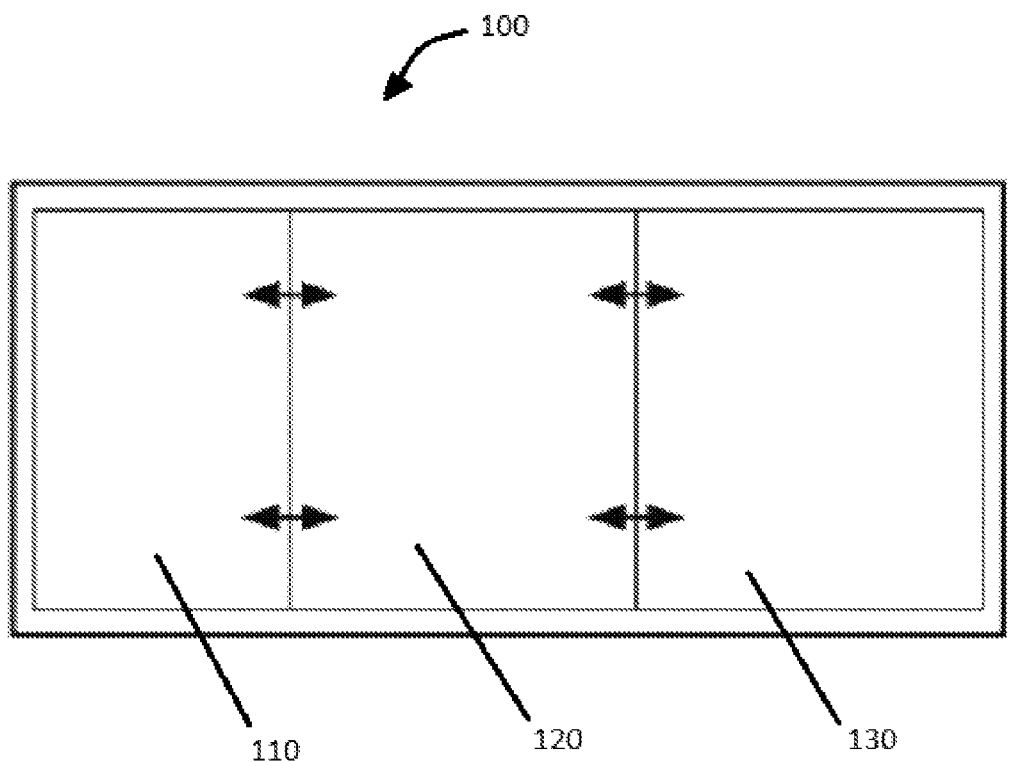
FIG. 1 is a block diagram of a single monolithic chip with three portions.

FIG. 1 is a block diagram of a single monolithic chip 100 having, for instance, three portions. In an example embodiment, one portion 110 may include RF MEMS, including an antenna and power generator. Another portion 120 may include CMOS devices and circuitry, for instance signal conditioning circuitry, a transmitter/receiver, and sensors, for instance temperature and humidity sensors. An additional portion 130 may include, for instance, physical sensor MEMS, such as capacitive MEMS, and pressure, acceleration, and strain sensors. Additional or fewer portions are contemplated; the number of portions shown and their suggested contents are just examples of what could be used.

Figure 2:
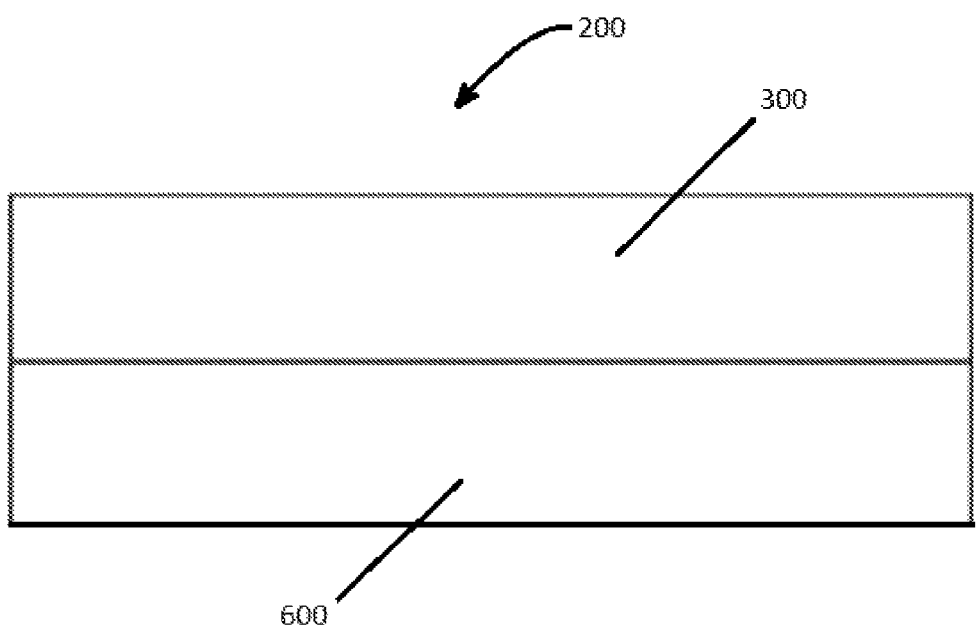
FIG. 2 is side elevation view of two pre-fabricated wafers fusion-bonded to form a monolithic Joint Circuit-Diaphragm Wafer.

In one example, shown in FIG. 2, two pre-fabricated wafers, such as a circuit wafer 300 and a diaphragm wafer 600 are fusion bonded to form a monolithic integrated capacitive pressure sensor 200. This example embodiment and its method of manufacture is disclosed in detail below.

Figure 3A:
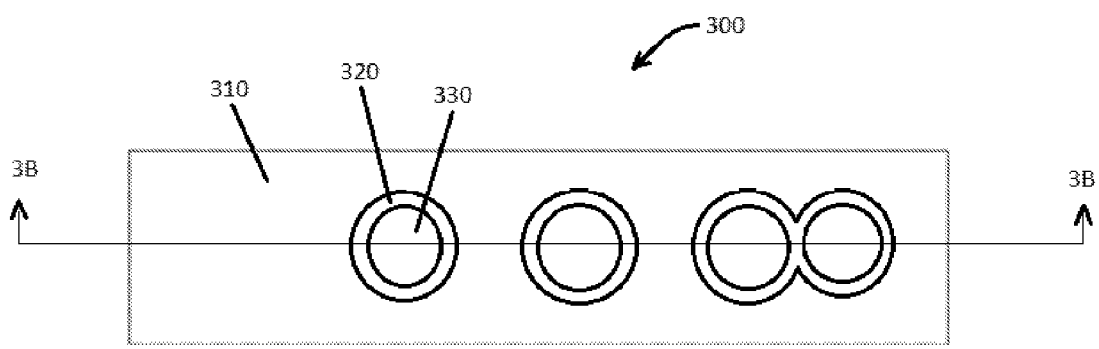
FIG. 3 depicts a Circuit Silicon wafer, having isolation trenches etched therein, with FIG. 3A being a top plan view and FIG. 3B being a side-elevation, cross-sectional view thereof.
Figure 3B:
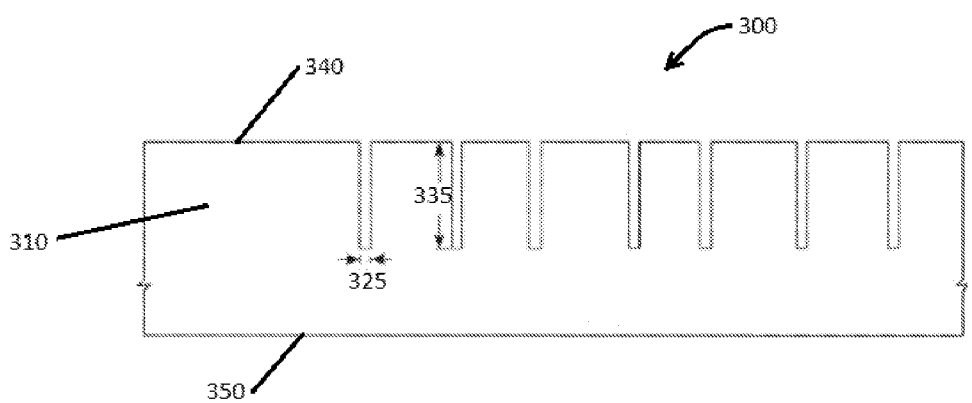

FIG. 3 shows a top plan view, FIG. 3A, and a side-elevation, cross-sectional view, FIG. 3B, of a circuit wafer 300 according to one example embodiment 200 (to increase clarity of the Figures, no cross-hatching is shown in the cross-sectional views of parts made of silicon). In this embodiment, circuit wafer 300 is formed from a wafer of p-type Silicon 310, having a top or upper surface or portion 340 and a bottom or lower surface or portion 350. Isolation trenches 320 having a width 325 and a depth 335 may be formed in the top surface 340 by, for instance, deep reactive ion etching (DRIE), to create cylindrical pillars 330, which may act as conduction columns as shown herein.

Figure 4A:
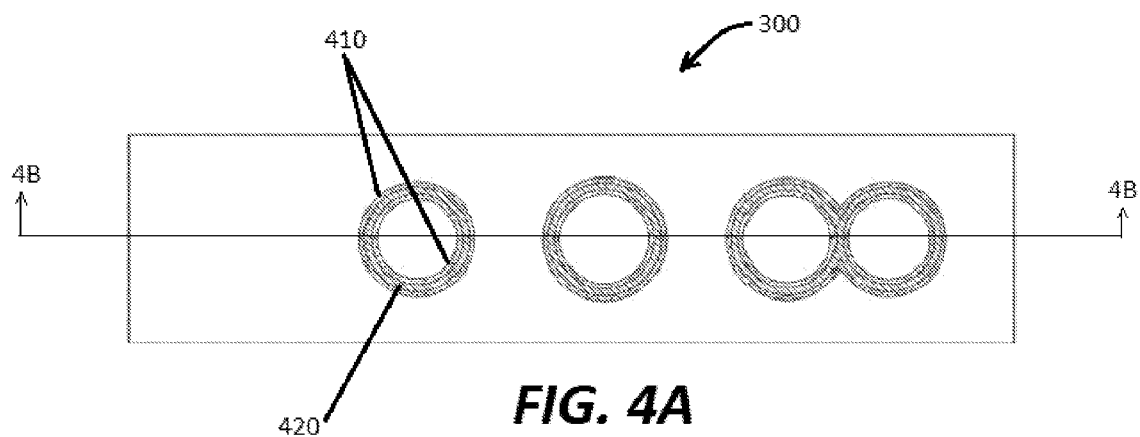
FIG. 4 depicts the Circuit Silicon wafer of FIG. 3, having oxide-coated, polysilicon-filled isolation trenches, with FIG. 4A being a top plan view and FIG. 4B being a side-elevation, cross-sectional view thereof.
Figure 4B:
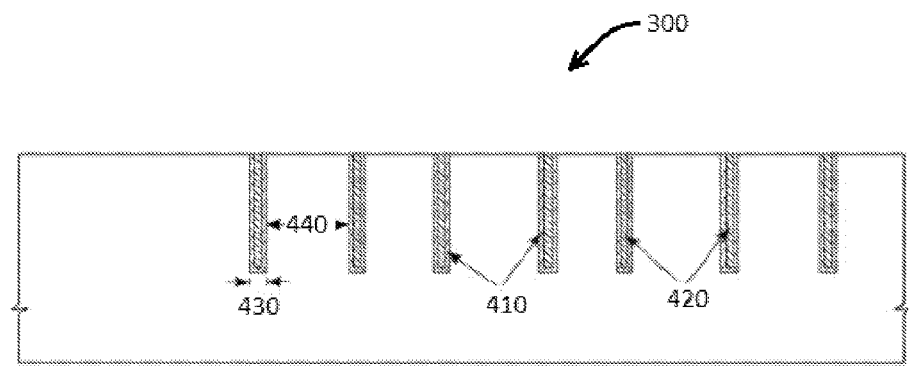

Turning to FIG. 4, circuit wafer 300 may be further processed by growing an oxide layer 410 on the wafer 300, then filling the remaining openings in the trenches 320 by depositing polysilicon 420 therein. All exterior surfaces of the wafer 300 are then polished back to the Silicon surface, for instance by chemical-mechanical polishing (CMP).

Figure 5A:
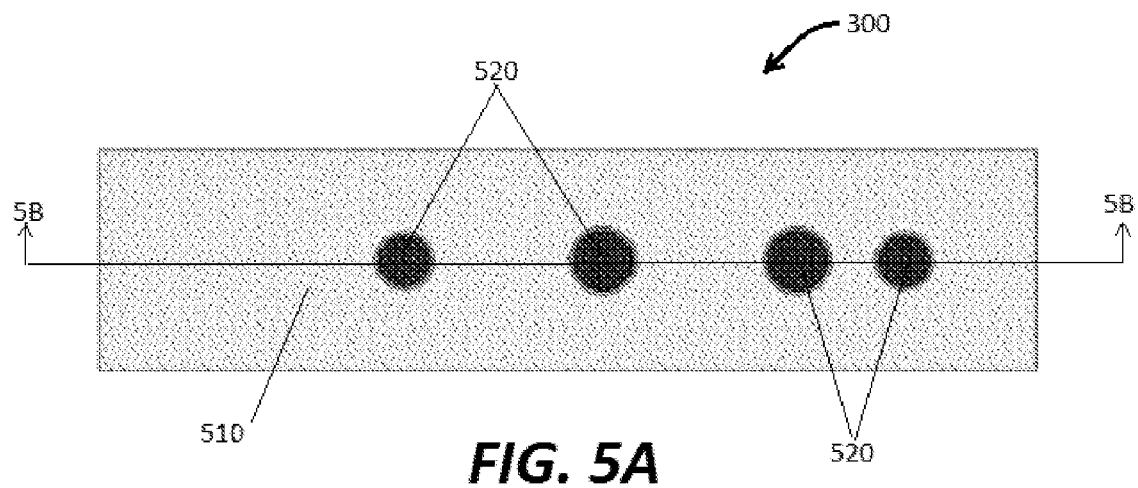
FIG. 5 depicts the Circuit Silicon wafer of FIG. 4, having LOCOS oxidation on top and metal silicide plates between the isolation trenches, with FIG. 5A being a top plan view and FIG. 5B being a side-elevation, cross-sectional view thereof.
Figure 5B:
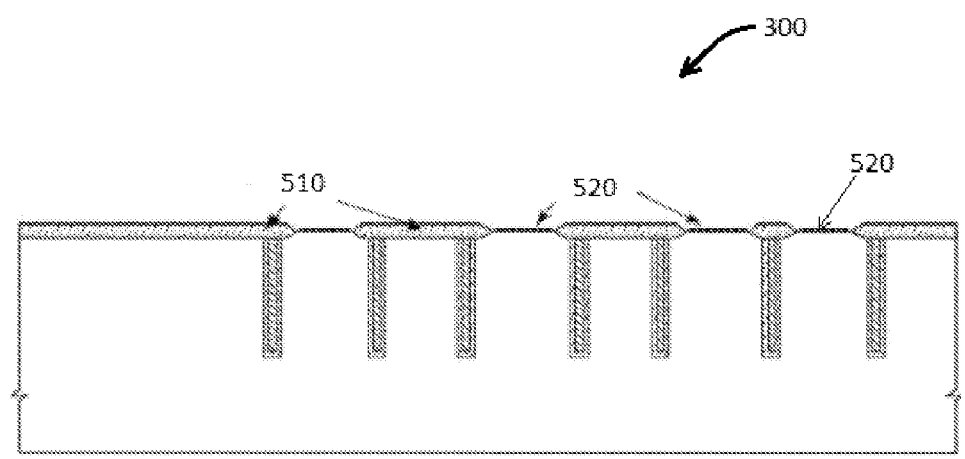

As shown in FIG. 5, the top surface 340 of circuit wafer 300 may then receive a field oxide layer 510 applied by the local oxidation of Silicon process (LOCOS). Metal silicide plates 520 may then be applied atop columns 330. Other materials and processes known to those of skill in the art may be used to achieve similar results with circuit wafer 300.

Figure 6A:
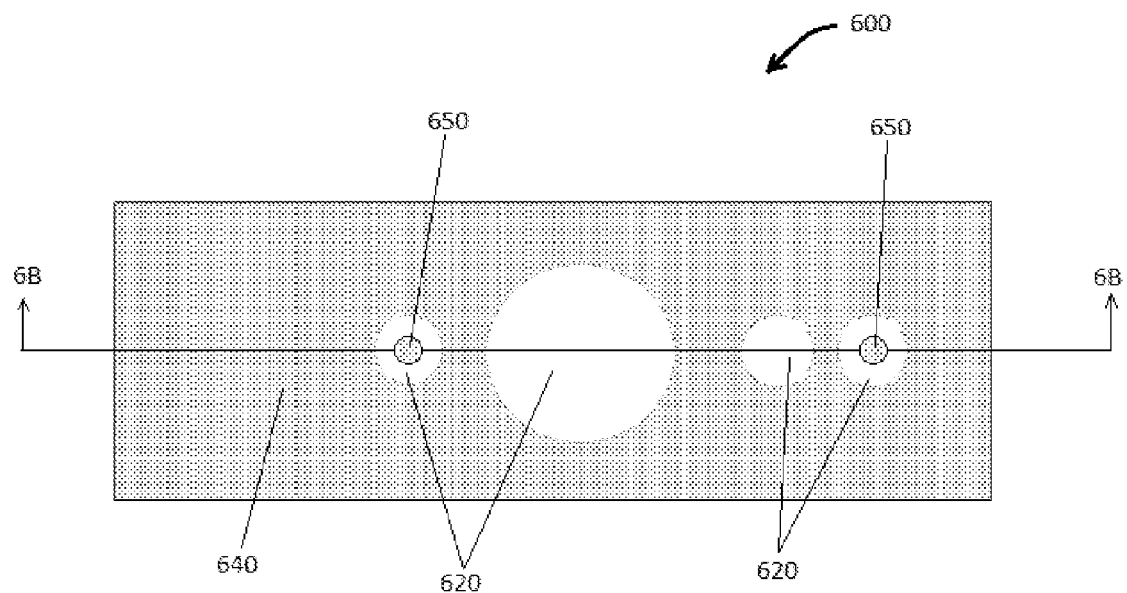
FIG. 6 depicts a Diaphragm Silicon wafer, formed from a p-type device layer of a Silicon on insulator (SOI) wafer, topped by LOCOS oxidation, with FIG. 6A being a top plan view and FIG. 6B being a side-elevation, cross-sectional view thereof.
Figure 6B:
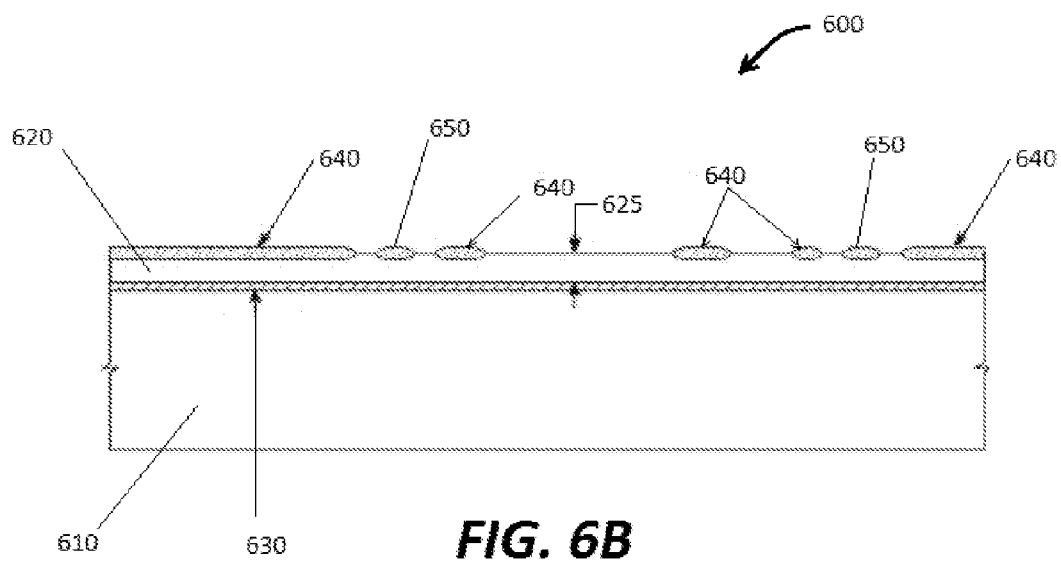

Turning to FIG. 6, the diaphragm wafer 600 and its processing will now be described. Diaphragm wafer 600 may begin as a Silicon on insulator (SOI) wafer, with a p-type device layer. The example diaphragm wafer 600 shown in FIG. 6 includes a p (100) orientation Silicon wafer 610, separated from a p-type device layer of Silicon 620 by a Silicon dioxide insulator 630. The thickness ("D") of the device layer 620 is represented by numeral 625. A field oxide layer 640 may then be applied to appropriate portions of the top of diaphragm wafer 600 as shown in FIG. 6, leaving two circular bumps of field oxide 650.

Figure 7A:
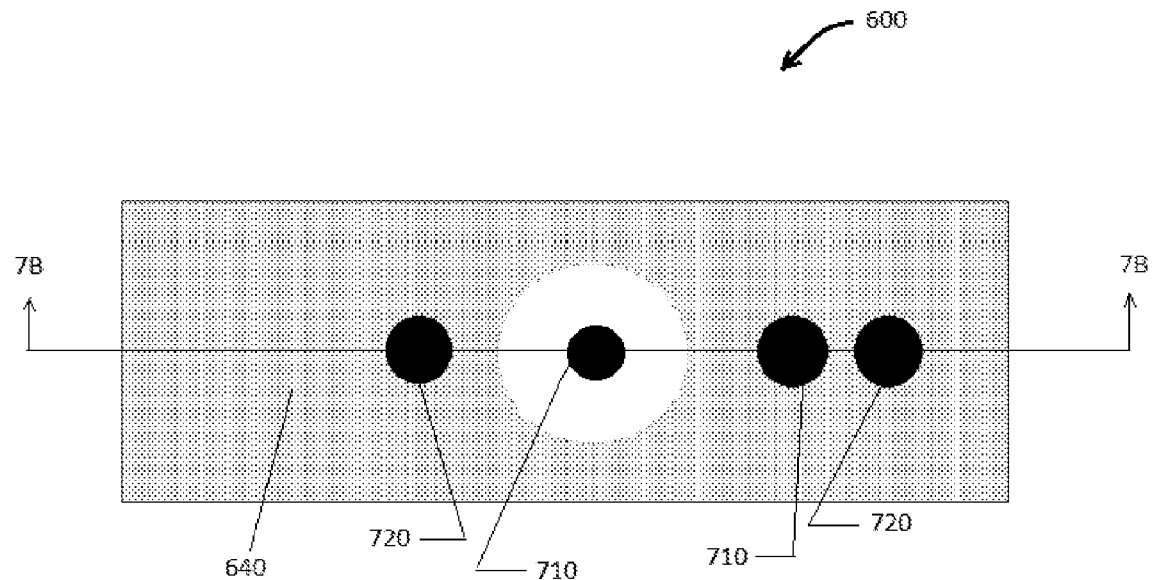
FIG. 7 depicts the Diaphragm Silicon wafer of FIG. 6 with metal silicide added thereto, with FIG. 7A being a top plan view and FIG. 7B being a side-elevation, cross-sectional view thereof.
Figure 7B:
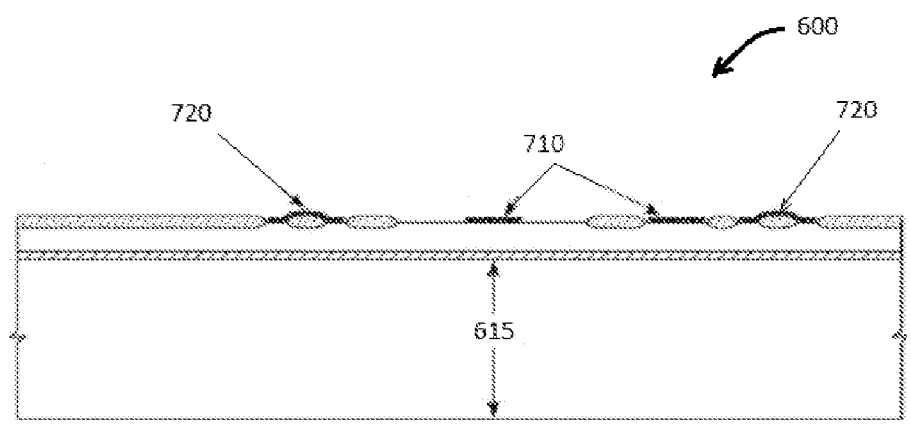

As shown in FIG. 7, metal silicide plates 710 may be provided on the p-type device layer of Silicon 620. Where metal silicide is deposited over the circular bumps of field oxide 650, a metal silicide structure for bump springs 720 is provided. Handle wafer thickness ("T") of the p (100) orientation Silicon wafer 610 is represented by numeral 615.

Figure 8A:
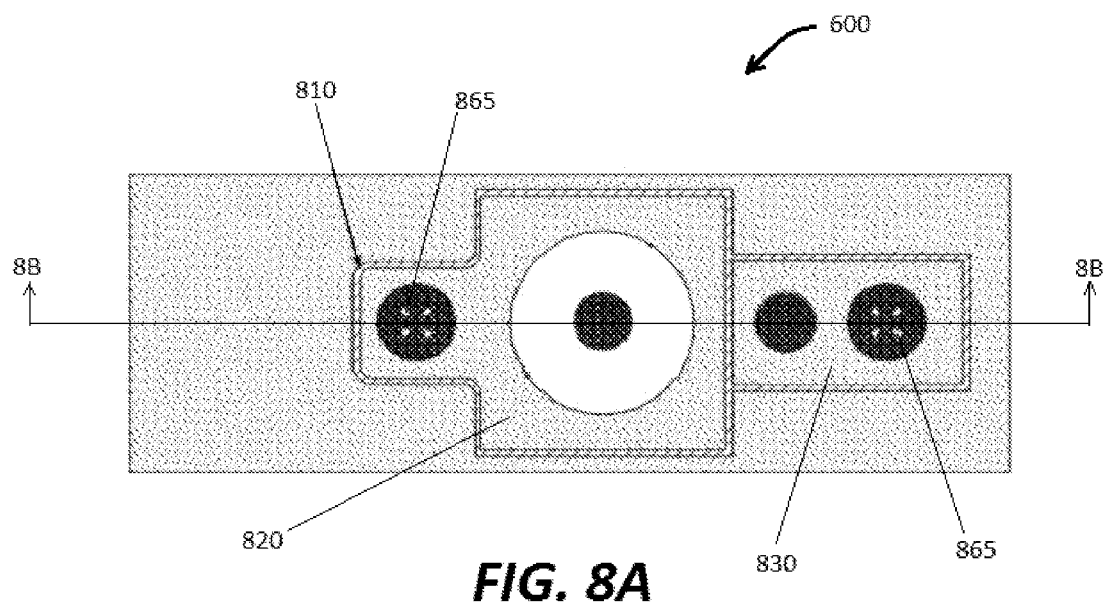
FIG. 8 depicts the Diaphragm Silicon wafer of FIG. 7 having been etched to form an electrical isolation feedthrough with FIG. 8A being a top plan view and FIG. 8B being a side-elevation, cross-sectional view thereof.
Figure 8B:
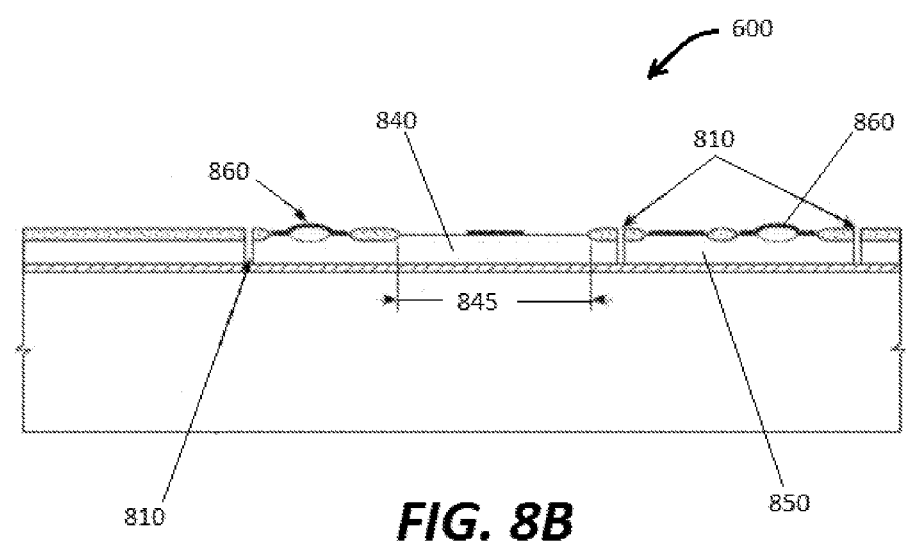

FIG. 8 depicts diaphragm wafer 600 with an isolation trench 810 etched down to the insulating layer 630, thereby dividing the p-type device layer of Silicon 620 and field oxide layer 640 into two electrically isolated plates: a sensing MEMS plate 820 and a reference plate 830. The sensing MEMS plate 820 includes a metal silicide bump spring 860 selectively etched into the oxide layer underneath, as shown at 865. The sensing MEMS plate 820 further includes a sense feed through region 840 defined by a sensing diaphragm diameter ("W0") 845. The reference plate 830 includes a metal silicide bump spring 860 selectively etched into the oxide layer underneath, as shown at 865. The reference plate 830 further includes a reference feed through region 850.

Figure 9:
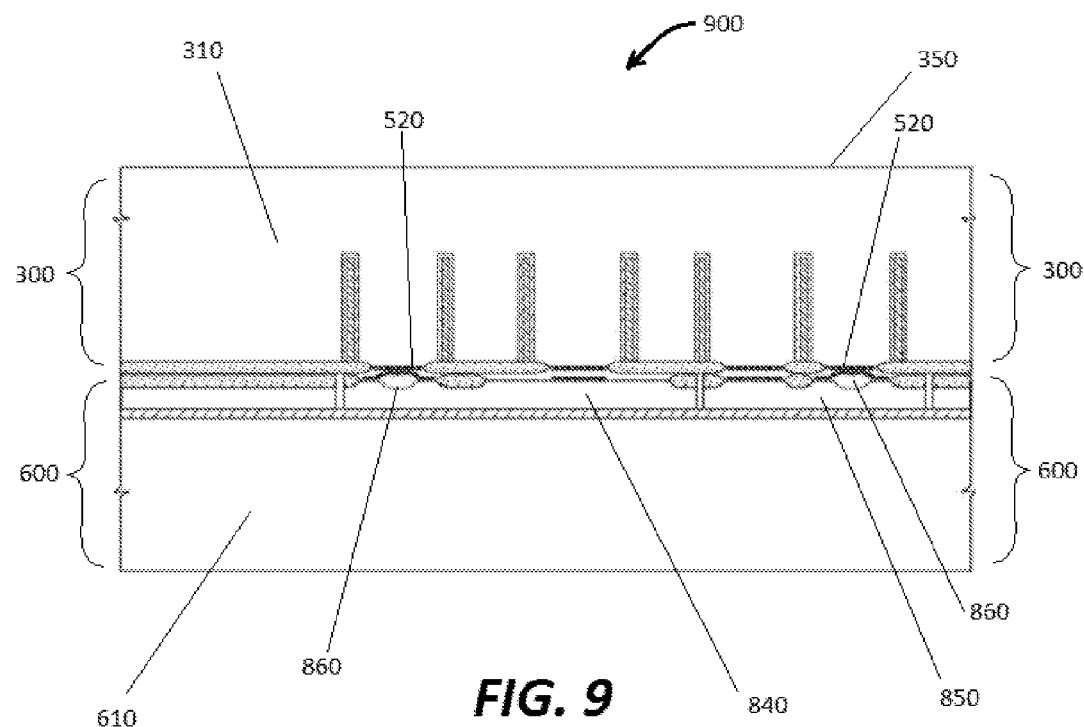
FIG. 9 is a side-elevation, cross-sectional view of a Joint Circuit-Diaphragm Wafer formed from the Circuit Silicon wafer of FIG. 5 inverted, aligned and fusion bonded onto the Diaphragm Silicon wafer of FIG. 7.

Next the joining of circuit wafer 300 with the diaphragm wafer 600 will be discussed. As shown in FIG. 9, in this example embodiment the circuit wafer 300 is inverted and fusion-bonded on top of the diaphragm wafer 600, with the distal metal silicide plates 520 of the circuit wafer 300 aligned overtop the metal silicide bump springs 860 of the diaphragm wafer 600, such that the metal silicide bump springs 860 on the diaphragm wafer 600 deform against and are electrically in contact with the metal silicide plates 520 on the circuit wafer 300. The bottom surface 350 of the circuit wafer 300 thus becomes the top surface 350 of the combined circuit wafer/diaphragm wafer 900.

Figure 10:
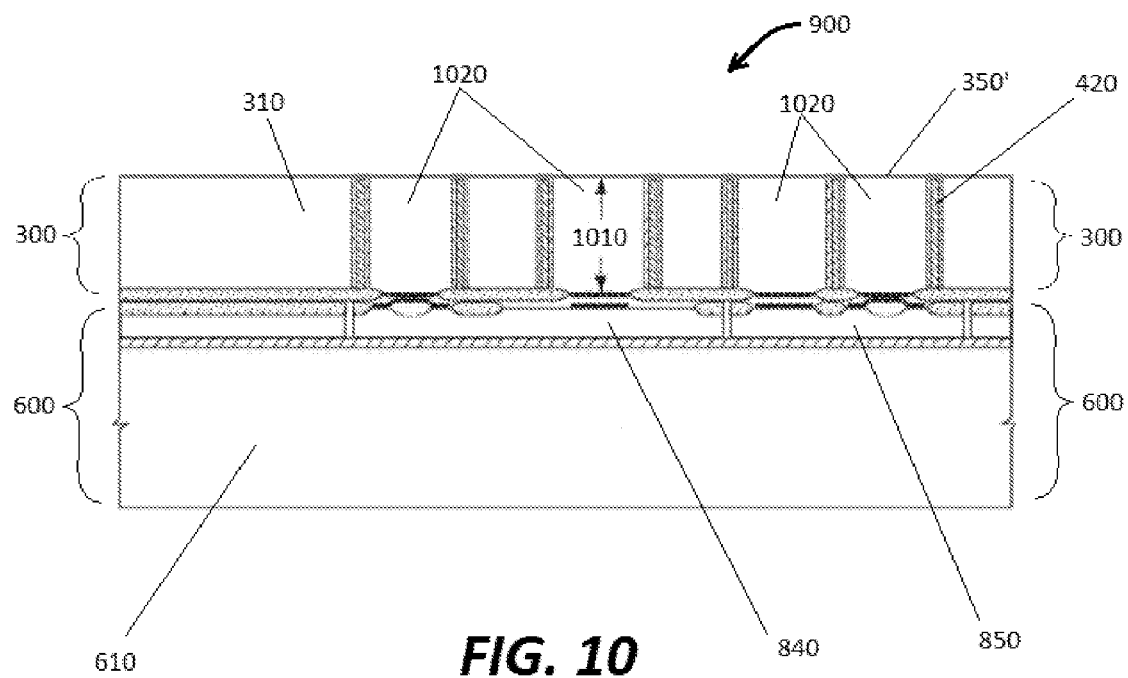
FIG. 10 is a side-elevation, cross-sectional view of the Joint Circuit-Diaphragm Wafer of FIG. 9, the top surface thereof having been ground down to expose filled vias.

The top surface 350 of the combined circuit wafer/diaphragm wafer 900 may be ground down to a predetermined thickness ("H1") 1010 and polished, as shown in FIG. 10. FIG. 10 shows the top surface 350 ground down to new surface 350', thereby exposing filled vias 1020.

Figure 11:
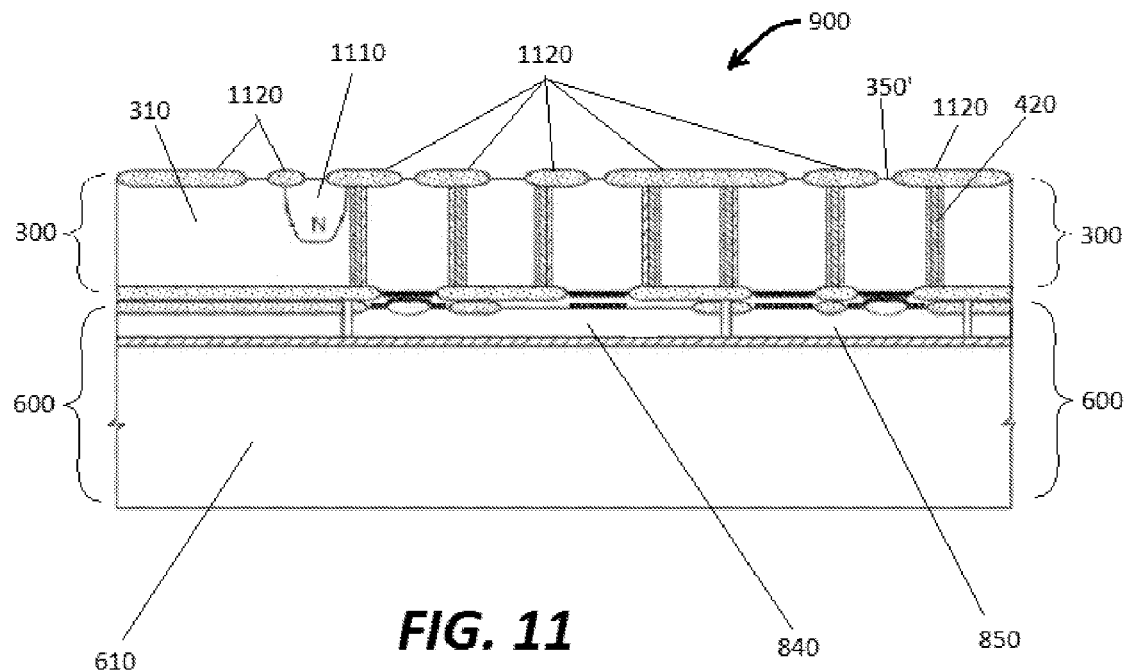
FIG. 11 is a side-elevation, cross-sectional view of the Joint Circuit-Diaphragm Wafer of FIG. 10, having added an n-well and areas of LOCOS oxidation.

With filled vias 1020 exposed, an n-well 1110 may be formed to the top surface 350' a shown in FIG. 11, LOCOS may be used to apply field oxide to predetermined areas 1120 of new top surface 350'.

Figure 12:
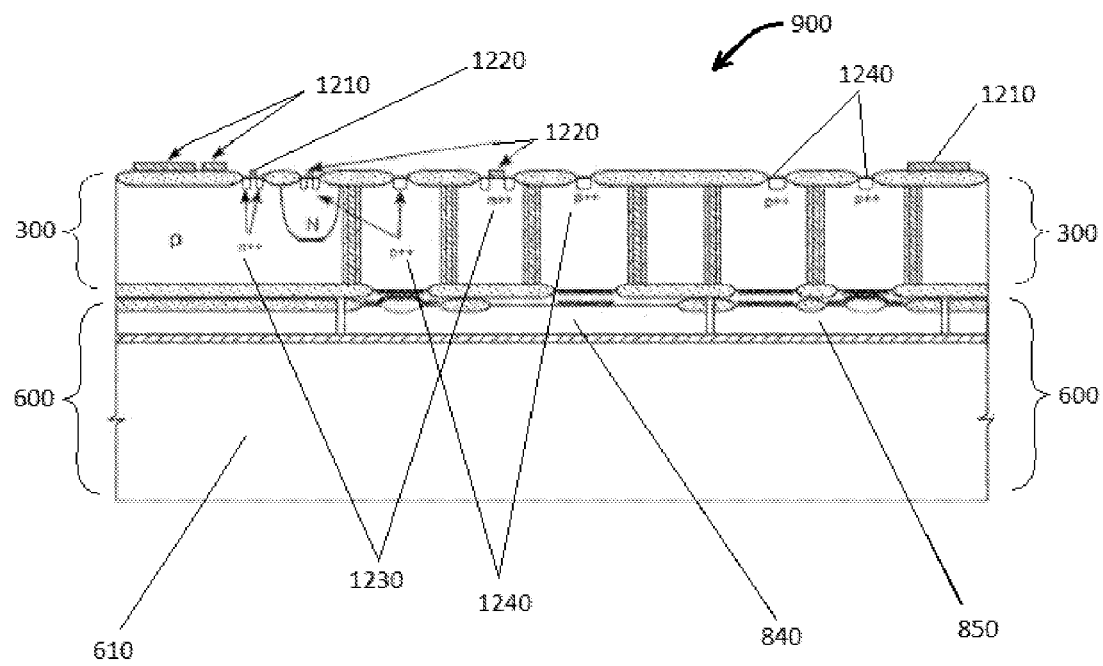
FIG. 12 is a side-elevation, cross-sectional view of the Joint Circuit-Diaphragm Wafer of FIG. 11, having added poly-Silicon structures, interconnects and gates, and heavily doped n++ and p++ regions.

As further shown in FIG. 12, poly-Silicon structures and interconnects 1210 may be provided for, among other things, a CMOS transistors gate, resistor(s), capacitor plate and interconnects. In addition to n-well 1110, electrically active areas of the Silicon include heavily doped regions, n++ 1230 and p++ 1240, to provide electron sources and drains for CMOS devices and contacts (not shown).

Figure 13:
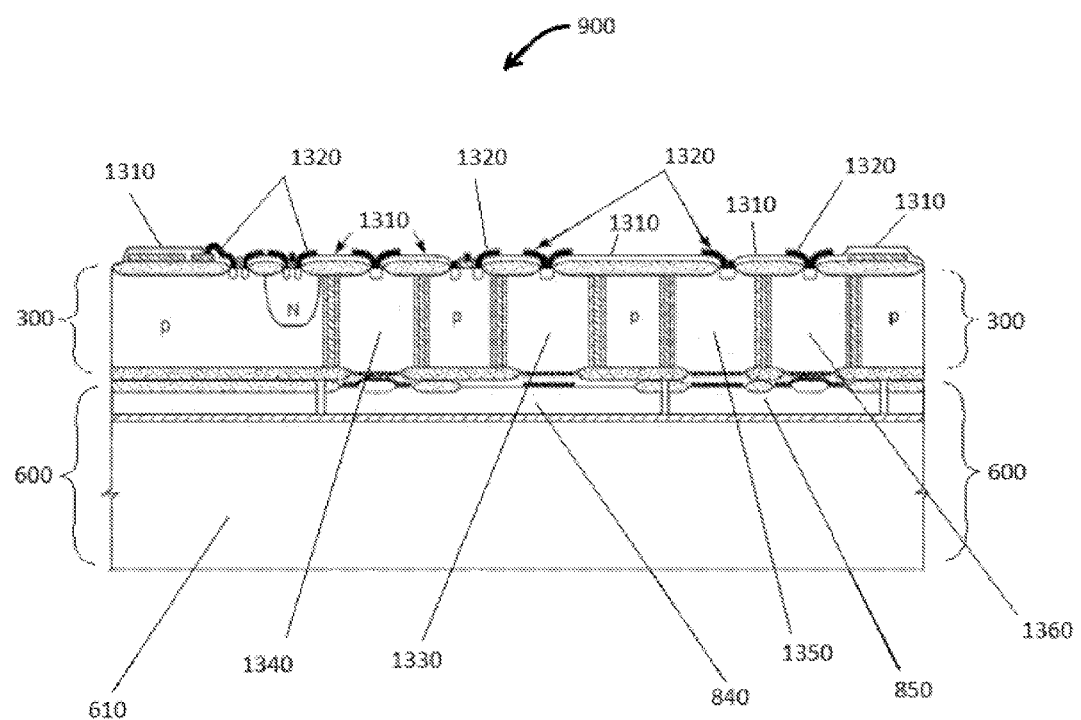
FIG. 13 is a side-elevation, cross-sectional view of the Joint Circuit-Diaphragm Wafer of FIG. 12, having added an insulation layer of oxide with contact holes therein, and metal interconnects.

An insulation layer of oxide 1310 may then be deposited on top of the combined circuit wafer/diaphragm wafer 900 as shown in FIG. 13. Metal internconnects 1320 are placed in electrical contact with the active regions and polysilicon layer 1210 through contact holes in the oxide layer 1310. In the example shown in FIG. 13, active areas include a "sense top plate" contact column 1330, a "sense bottom plate" contact column 1340, a "reference top plate" contact column 1350, and a "reference bottom plate" contact column 1360.

Figure 16:
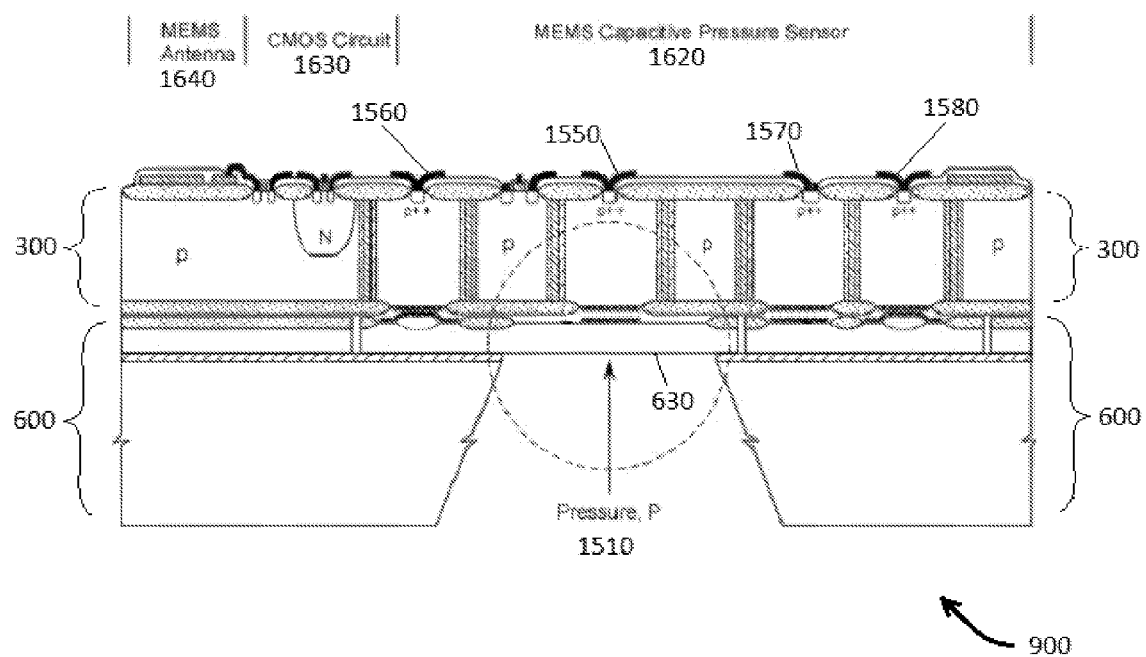
FIG. 16 is a side-elevation, cross-sectional view of the Joint Circuit-Diaphragm Wafer of FIGS. 14 and 15, depicting placement of circuitry for MEMS antenna, CMOS circuit, and MEMS capacitive pressure sensor.

Metallization typically forms the final interconnects for the circuit 1630 and sensor 1620, as depicted in FIG. 16. This is usually the case for single polysilicon and single metal processes. However, more advanced circuit design and fabrication could utilize multiple layers of polysilicon and metal according to the system and method described herein.

Figure 14A:
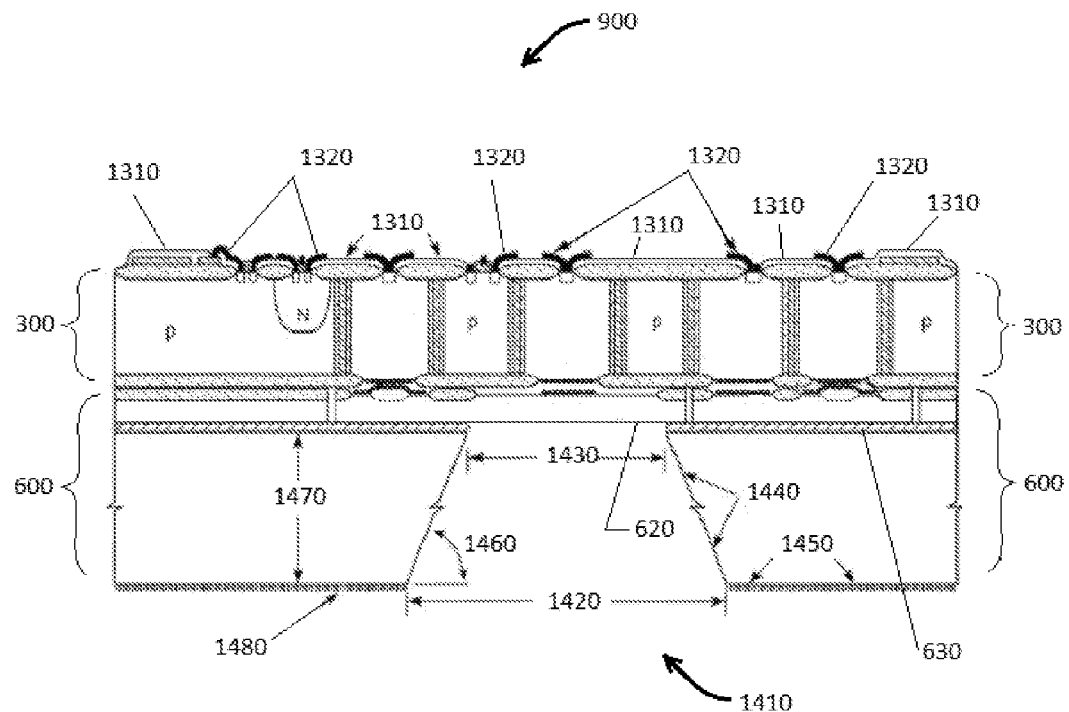
FIG. 14A is a side-elevation, cross-sectional view thereof.
Figure 14B:
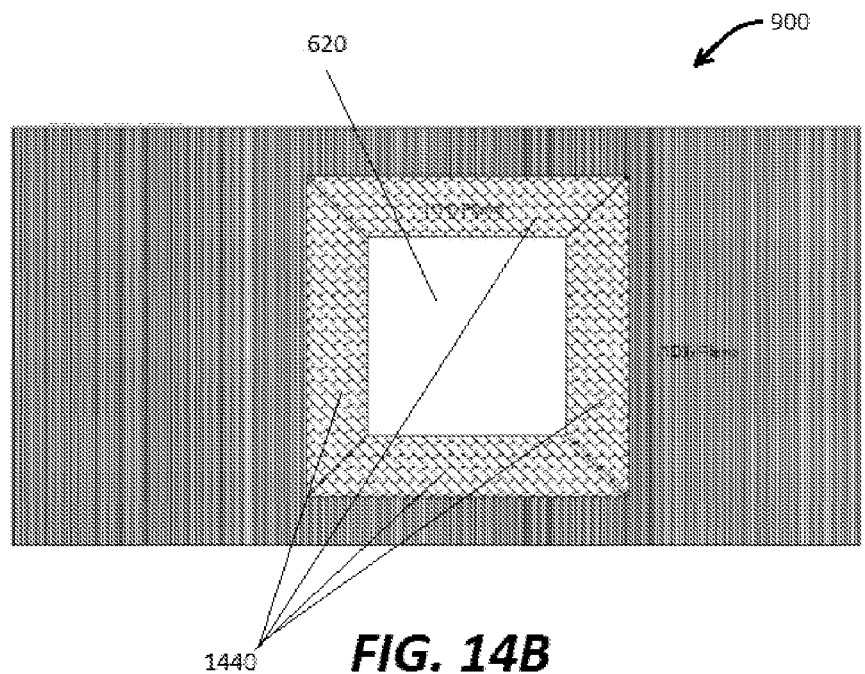
FIG. 14B is a bottom plan view thereof.

FIG. 14 depicts the example combined circuit wafer/diaphragm wafer 900 with a sensing window 1410 in the bottom. A sensing window 1410 may be etched in using wet anisotropic etch, such as KOH (Potassium Hydroxide). The etching is very selective to the plane of the Silicon crystal, aggressively etching the lower plane 1450 while providing almost no etching on the angled plane 1440. The effective sensing window 1430 is determined by the etching mask opening 1420 and the crystal plane angle 1460 between the lower plane 1450 and the angled plane 1440, in view of the thickness 1470 of the Silicon crystal plane. In one embodiment the crystal plane angle 1460 is 54.7 degrees in the orientation shown in FIG. 14. The buried Silicon dioxide layer 630 is etched away to expose the silicone membrane 620. The etching mask 1480 can be, for example, Silicon Nitride, Si3N4.

FIG. 15 depicts the combined circuit wafer/diaphragm wafer 900 (i.e., Joint Circuit-Diaphragm Wafer 900) in use, having pressure 1510 applied thereto. The Joint Circuit-Diaphragm Wafer 900 includes a sense capacitor (Cs) 1590 and a reference capacitor 1595 (Cr) in vacuum cavities 1530 (where the pressure is a predetermined amount, such as zero gage pressure). The Joint Circuit-Diaphragm Wafer 900 further includes a sense capacitor top plate contact 1550, a sense capacitor bottom plate contact 1560, a reference capacitor top plate contact 1570, and a reference capacitor bottom plate contact 1580. The sense capacitance in this example system is proportional to 1/(G−d), where G is the gap 1520 between the capacitor plates, and d is the amount of deflection 1540 of the diaphragm 630, as shown in FIGS. 15A, 15B and 15C. For the first order approximation, d 1540 is proportional to P 1510 (or P 1510' where P is greater than zero).

FIG. 16 depicts the placement of example circuitry 1610 on the Joint Circuit-Diaphragm Wafer 900. For instance, circuitry may include a MEMS capacitive pressure sensor 1620, a CMOS circuit 1630, and a MEMS antenna 1640. As would be clear to a person of ordinary skill in the art, such types of circuitry would readily combine with the Joint Circuit-Diaphragm Wafer 900 disclosed herein to form an example embodiment of a wireless self-powered monolithic integrated capacitive sensor.

Figure 17:
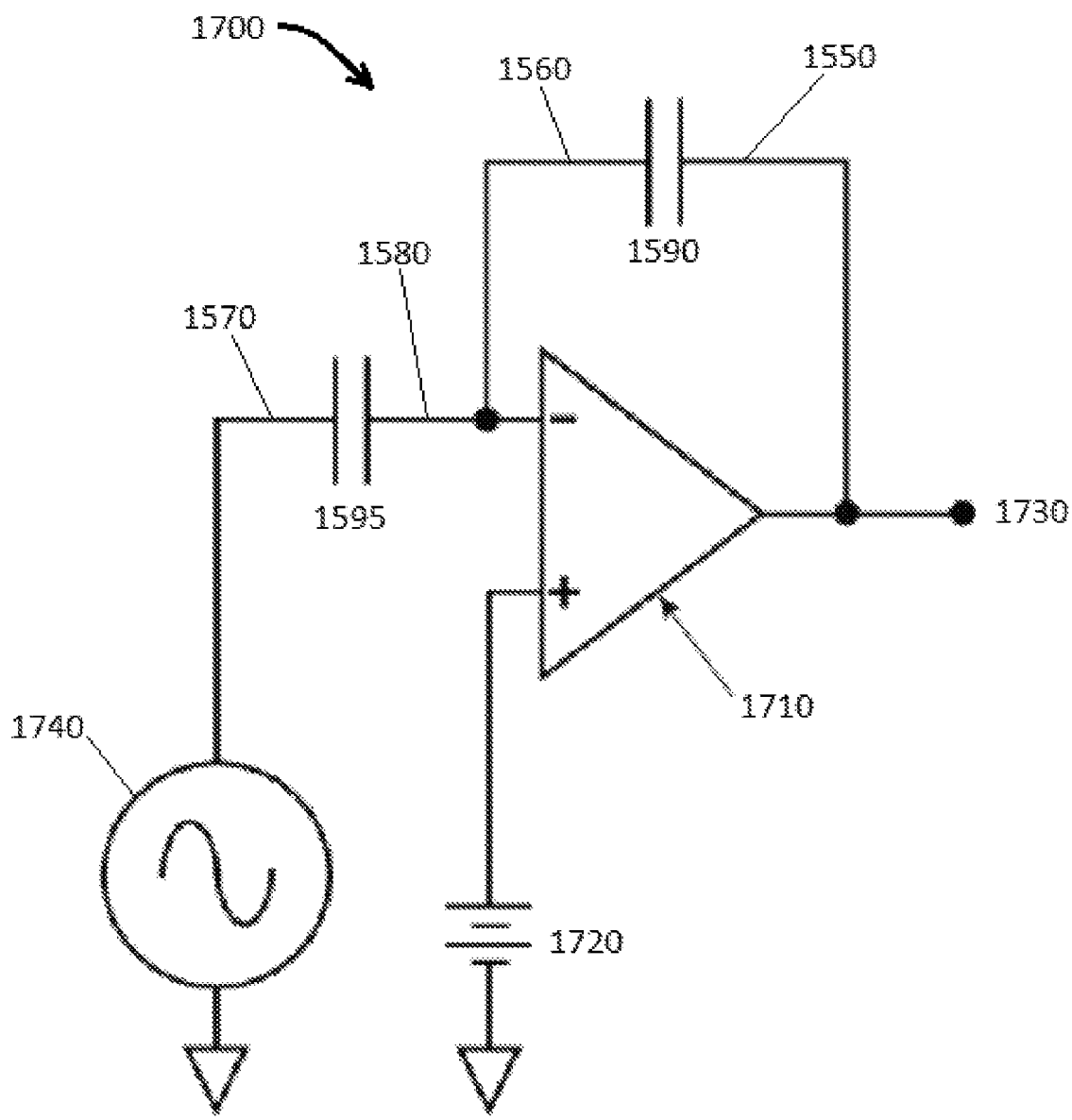
FIG. 17 is a schematic of an example circuit for use with a wireless self-powered monolithic integrated capacitive sensor.

A schematic of an example circuit 1700 for use in connection with a wireless self-powered monolithic integrated capacitive sensor, such as that described in the foregoing example, is shown in FIG. 17. The example circuit shown in FIG. 17 includes a sense capacitor (Cs) 1590 with one side linked to one side of a reference capacitor 1595 (Cr), for instance by sense capacitor bottom plate contact 1560 and reference capacitor bottom plate contact 1580, which together are connected to one side of an operational amplifier 1710. The other side of the operational amplifier 1710 is connected to a reference voltage 1720, for instance as provided by the system described herein. The other side of the reference capacitor 1595 (Cr) is connected by reference capacitor top plate contact 1570 to an AC voltage source 1740. The other side of sense capacitor (Cs) 1590 joins with the output of the operational amplifier 1710, via sense capacitor top plate contact 1550, to provide an output voltage at 1730.

The example monolithic systems disclosed herein includes two capacitors 1590, 1595, linked as shown to provide a net voltage output 1730 that varies only when the outputs of the capacitors 1590, 1595 vary relative to each other. When the monolithic system experiences certain environmental changes, such as temperature changes, the two capacitors 1590, 1595 experience the changes essentially equally, leading to no relative change between them. With no relative changes between the capacitors 1590, 1595, their net output voltage 1730 would remain constant under the presently disclosed system. In this way the system controls for environmental factors, and can provide a steady output even as environmental conditions change. As designed, there is only one factor that should cause capacitors 1590, 1595 to have different outputs relative to each other, and that is pressure, i.e., the very thing the device is supposed to measure (since the sense capacitor 1590 is exposed to external pressure while the reference capacitor is not).

The above description of the disclosed embodiments is provided to enable persons skilled in the art to make or use the invention. Various modifications to these embodiments will be readily apparent to those skilled in the art, and the generic principles defined herein can be applied to other embodiments without departing from the spirit or scope of the invention. Thus, the invention is not intended to be limited to the embodiments shown herein but is to be accorded the widest scope consistent with the principles and novel features disclosed herein.

The invention claimed is:

1. A wireless self-powered monolithic integrated capacitive sensor, comprising:
    a sensing capacitor that produces a first signal; and
    a reference capacitor that produces a second signal;
    wherein the wireless self-powered monolithic integrated capacitive sensor produces a sensing signal based on the difference between the first signal and the second signal;
    a CMOS circuit wafer; and
    a diaphragm wafer;
    wherein the CMOS circuit wafer is fusion bonded to the diaphragm wafer.

2. A wireless self-powered monolithic integrated capacitive sensor, comprising:
    a sensing capacitor that produces a first signal; and
    a reference capacitor that produces a second signal;
    wherein the wireless self-powered monolithic integrated capacitive sensor produces a sensing signal based on the difference between the first signal and the second signal;
    a circuit wafer having one or more metal silicide plates; and
    a diaphragm wafer having one or more metal silicide bump springs;
    wherein a metal silicide plate is in electrical contact with a metal silicide bump spring.

3. The wireless self-powered monolithic integrated capacitive sensor of claim 1, wherein the wireless self-powered monolithic integrated capacitive sensor senses pressure.

4. The wireless self-powered monolithic integrated capacitive sensor of claim 1, wherein the sensing signal is not substantially affected by variations in temperature.

5. A wireless self-powered monolithic integrated capacitive sensor, comprising:
    RF MEMS;
    a CMOS device; and
    physical sensor MEMS.

6. The wireless self-powered monolithic integrated capacitive sensor of claim 5, further comprising:
    a circuit wafer; and
    a diaphragm wafer.

7. The wireless self-powered monolithic integrated capacitive sensor of claim 5, further comprising:
    a circuit wafer fusion bonded to a diaphragm wafer.

8. The wireless self-powered monolithic integrated capacitive sensor of claim 5, further comprising:
    a circuit wafer having one or more metal silicide plates; and
    a diaphragm wafer having one or more metal silicide bump springs;
    wherein a metal silicide plate is in electrical contact with a metal silicide bump spring.

9. The wireless self-powered monolithic integrated capacitive sensor of claim 5, wherein the wireless self-powered monolithic integrated capacitive sensor senses pressure.

10. The wireless self-powered monolithic integrated capacitive sensor of claim 5, wherein the sensor's output is not substantially affected by variations in temperature.

11. A method of manufacturing a wireless self-powered monolithic integrated capacitive sensor, comprising the steps of:
    fusion bonding a CMOS circuit silicon wafer to a diaphragm silicon wafer.

12. The method of claim 11, further comprising the steps of:
    etching an isolation trench on the CMOS circuit silicon wafer or the diaphragm silicon wafer to electrically isolate a first portion of the etched wafer from a second portion of the etched wafer.

13. The method of claim 11, further comprising the steps of:
    applying form field oxide by local oxidation of silicon (LOCOS) to the CMOS circuit silicon wafer or the diaphragm silicon wafer.

14. The method of claim 11, further comprising the steps of:
    applying one or more metal silicide plates to the CMOS circuit silicon wafer or the diaphragm silicon wafer.

15. A method of manufacturing a wireless self-powered monolithic integrated capacitive sensor, comprising the steps of:
    fusion bonding a circuit silicon wafer to a diaphragm silicon wafer; and
    creating an electrically connective bump spring containing field oxide or metal silicide on the circuit silicon wafer or the diaphragm silicon wafer.

16. The method of claim 11, further comprising the steps of:
    grinding down the CMOS circuit silicon wafer or the diaphragm silicon wafer to a predetermined thickness.

17. The method of claim 11, further comprising the steps of:
    adding heavily doped n++ regions and p++ regions in either the CMOS circuit silicon wafer or the diaphragm silicon wafer.

18. The method of claim 11, further comprising the steps of:
    etching a sensing window in either the CMOS circuit silicon wafer or the diaphragm silicon wafer.

* * * * *